United States Patent
Schlee et al.

(10) Patent No.: US 8,290,087 B2
(45) Date of Patent: Oct. 16, 2012

(54) SAMPLE RATE CONVERSION IN DELTA-SIGMA MODULATORS

(75) Inventors: Johannes Schlee, Ulm (DE); Maik Riegler, Blaustein (DE)

(73) Assignee: Ubidyne, Inc., Wilmington, DE (US)

( * ) Notice: Subject to any disclaimer, the term of this patent is extended or adjusted under 35 U.S.C. 154(b) by 134 days.

(21) Appl. No.: 12/739,052

(22) PCT Filed: Oct. 21, 2008

(86) PCT No.: PCT/EP2008/064225
§ 371 (c)(1),
(2), (4) Date: Sep. 15, 2010

(87) PCT Pub. No.: WO2009/053369
PCT Pub. Date: Apr. 30, 2009

(65) Prior Publication Data
US 2011/0007836 A1    Jan. 13, 2011

Related U.S. Application Data

(60) Provisional application No. 60/981,624, filed on Oct. 22, 2007.

(30) Foreign Application Priority Data

Oct. 22, 2007  (GB) .................................... 0720607.1

(51) Int. Cl.
*H04L 27/36* (2006.01)
(52) U.S. Cl. ........ 375/298; 375/295; 375/297; 375/261; 455/108; 455/118; 455/129
(58) Field of Classification Search .................. 375/295, 375/298, 297, 261; 455/108, 118, 129
See application file for complete search history.

(56) References Cited

U.S. PATENT DOCUMENTS

| 5,892,468 | A | 4/1999 | Wilson et al. |
| 7,061,989 | B2 * | 6/2006 | Bellaouar et al. ............. 375/295 |
| 7,084,799 | B1 | 8/2006 | Butler |
| 2005/0001748 | A1 | 1/2005 | Clement et al. |
| 2005/0075744 | A1 * | 4/2005 | Reefman et al. ................. 700/94 |
| 2005/0265481 | A1 | 12/2005 | Ballaouar et al. |
| 2007/0018718 | A1 | 1/2007 | Horng et al. |

FOREIGN PATENT DOCUMENTS

EP          1713175         10/2006
(Continued)

OTHER PUBLICATIONS

Larson et al, Digital Control of RF Power Amplifiers for Next-Generation Wireless Communications, Proceedings of ESSDERC, Grenoble, France, 2005, pp. 39-44.

(Continued)

*Primary Examiner* — Phuong Phu
(74) *Attorney, Agent, or Firm* — Stephen H. Eland; Dann, Dorfman, Herrell & Skillman

(57) ABSTRACT

Transmitter comprising a delta-sigma modulator (DSM), a sample rate converter (SRC) situated downstream of the delta-sigma modulator with respect to a direction of transmission signal flow, and a switching amplifier (SA) situated downstream of the sample rate converter (SRC) with respect to the direction of transmission signal flow. The invention as defined above allows for a decoupling of the clock frequency of the delta-sigma modulator (DSM) and the carrier frequency, for example in radio frequency (RF) signal generation applications using delta-sigma modulators. With the invention described herein it is possible to design the delta-sigma modulator independently of the carrier frequency.

12 Claims, 2 Drawing Sheets

FOREIGN PATENT DOCUMENTS

| | | |
|---|---|---|
| GB | 2427775 | 12/2007 |
| JP | 07-202824 | 8/1995 |
| WO | 94/05087 | 3/1994 |
| WO | 03/069783 | 8/2003 |
| WO | 2005/079240 | 9/2005 |
| WO | 2005/120001 | 12/2005 |
| WO | 2006/001748 | 1/2006 |
| WO | 2006/124060 | 11/2006 |

OTHER PUBLICATIONS

Asbeck et al, Synergistic Design of DSP and Power Amplifiers for Wireless Communications, IEEE Transactions on Microwave Theory and Techniques, vol. 49, No. 11, Nov. 2001, pp. 2163-2169.

Shawn P. Stapleton, Presentation on High Efficiency RF Power Amplifiers Using Bandpass DSM, Seminar materials, Jun. 2001, 24 pages.

Mingliang Liu, Tutorial on Designing Delta-Sigma Modulators: Part 1, http://www.eetimes.com/electronics-news/4144361/Tutorial-on-Designing-Delta-Sigma-Modulators-Part-1, Mar. 30, 2004, 9 pages.

Janet Smith, Understanding the CPRI Digital Interface Standard, Press Release Materials, Feb. 6, 2006, 5 pages.

UK Search Report issued in GB Application No. 0720607.1 on Feb. 19, 2008, 4 pages.

International Search Report & Written Opinion issued in PCT/EP08/64225 on Mar. 11, 2009, 14 pages.

\* cited by examiner

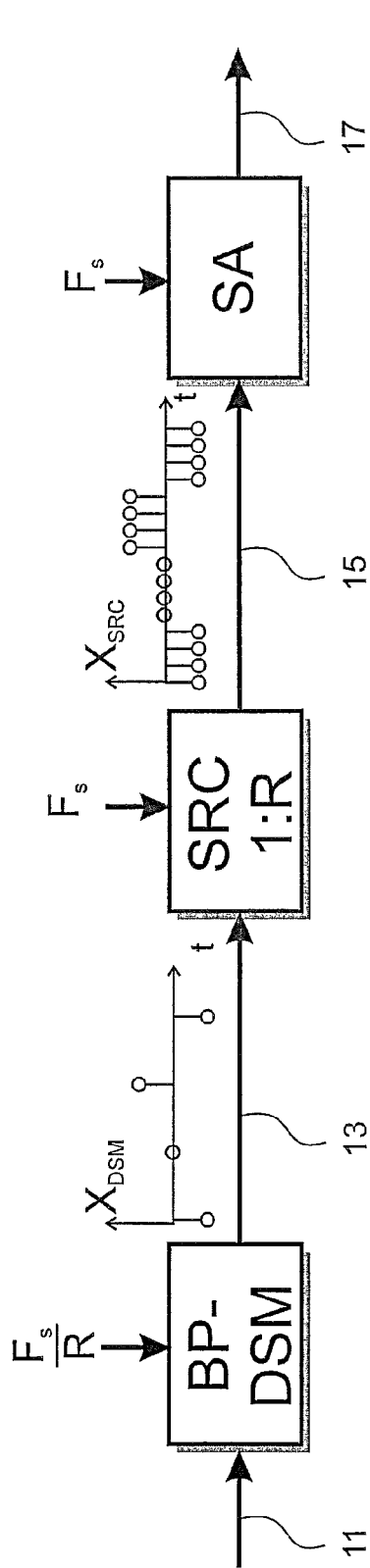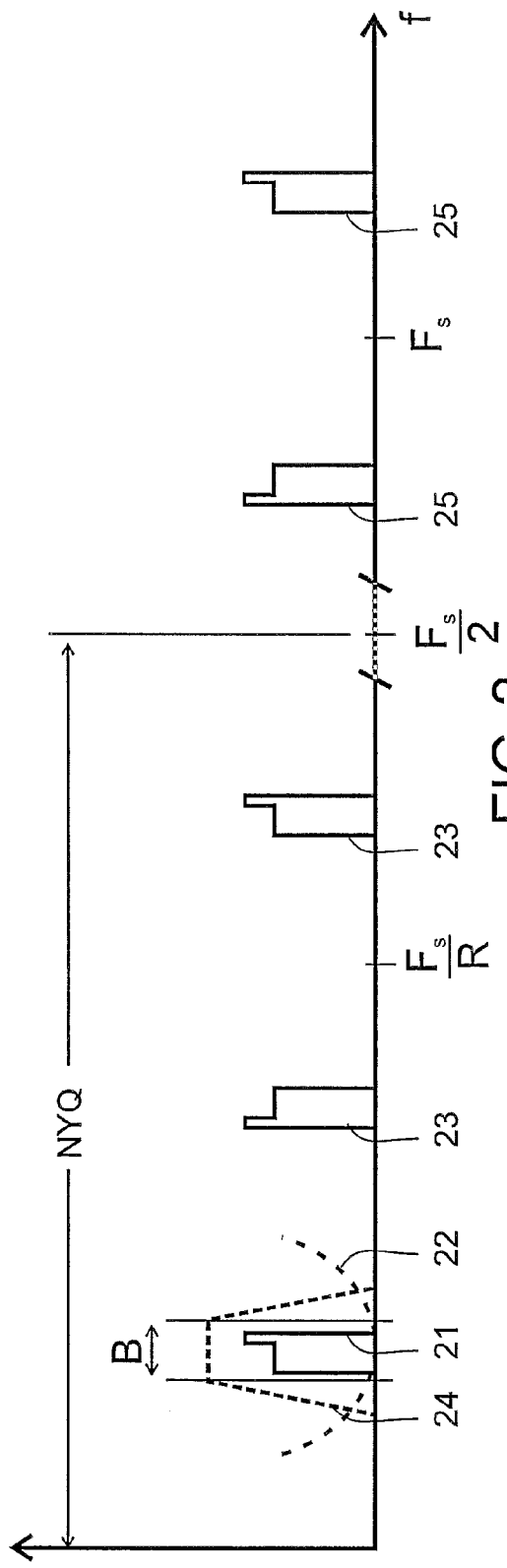

SAMPLE RATE CONVERSION IN DELTA-SIGMA MODULATORS

CROSS REFERENCE TO RELATED APPLICATIONS

This application is a national phase entry of International Application No. PCT/EP08/64225 filed on Oct. 22, 2008 which claims benefit and priority of U.S. Provisional Application No. 60/981,624 filed on Oct. 22, 2007 and UK Patent Application No. 0720607.1 filed on Oct. 22, 2007. The entire disclosure of each of the foregoing applications is hereby incorporated herein by reference.

FIELD OF THE INVENTION

The present invention relates to transmitters for telecommunication. In particular, the present invention relates to digital transmitters for radio frequency communication systems.

BACKGROUND OF THE INVENTION

Radio communication technology has greatly advanced in recent years, as evident by the high performance digital mobile phones currently available.

One of the components that make up a mobile communications network is the base transceiver station (BTS) which establishes a communications link with a mobile station (i.e. a mobile phone). By means of the communications link data are sent and received from the mobile stations and the BTS by an RF signal. The BTS transfers the communications data further into telephony or other communications networks. The BTS also receives data from the telephony or other communications networks that are to be sent to a mobile station.

The modern BTS have to cover a wide frequency bandwidth and a high dynamic range.

PRIOR ART

Delta-sigma modulators (DSM) and switching amplifiers are used, for example, within transmitters for RF and mobile communication. By using the switching amplifiers in RF power amplifiers high power efficiencies can be achieved. A drive signal for the switching amplifier should have a frequency that is higher than the carrier frequency of the RF signal. The delta-sigma modulators are well suited for the generation of the drive signal. In RF and mobile communication applications the delta-sigma modulator has to be clocked with a switching frequency $F_s$ of the switching amplifier. The high clock rate of the delta-sigma modulator allows a full digital implementation of the delta-sigma modulator only with restricted choice of parameters. This restricted parameter choice leads to performance degradation in the dynamic range and maximum amplitude of the delta-sigma modulator.

A first reason for the restricted parameter choice is the need to employ specific ratios between the switching frequency $F_s$ and the carrier frequency $F_c$. One example of the specific ratios is the so-called 4:1 mode in which the switching frequency $F_s$ is four times higher than that of the carrier frequency $F_c$, i.e. $F_s=4\,F_c$. Another example of the restricted parameter choice is the so-called 4:3 mode for which $F_s=4/3\,F_c$. In both the 4:1 mode and the 4:3 mode the switching frequency $F_s$ needs to be higher than the carrier frequency $F_c$. The choice of the switching frequency $F_s$ is further constrained by the desired bandwidth of the delta-sigma modulator due to the Nyquist theorem. The high switching frequency required in prior art delta-sigma modulators lead to high clock frequencies and thus to high power dissipation and high device temperature.

The state of the art is the usage of the delta-sigma modulators running at high frequencies. If the switching amplifier is operated at the switching frequency $F_s$, a band pass delta sigma modulator (BPDSM) has to be clocked with a frequency of $F_s$. When using a quadrature modulator, each of the base band delta-sigma modulator (BB DSM) has to be clocked at half the switching frequency, i.e. $F_s/2$. The high clock frequency leads to a high power dissipation and to the limits of technology for circuit implementation.

International Patent Application WO 2005/120001 A2 describes a fully digital transmitter including a digital sigma-delta modulator and a switching amplifier. The transmitter is designed to be used, for example, in a wireless telephone handset. A digital upconverter function operates in combination with a digital band-pass sigma-delta modulator to generate modulated digital signals at a sample frequency that is a multiple of the transmit frequency. To this end, the sigma-delta modulator needs to be operated above the transmit frequency, i.e. at a relatively high frequency.

In the article "Synergistic Design of DSP and Power Amplifiers for Wireless Communications" Peter M. Asbeck describes a transmitter architecture in which a digital up-converter precedes a band-pass sigma-delta modulator. The band-pass sigma-delta modulator drives a switching amplifier. The band-pass delta-sigma modulator and the digital up-converter are operated at the quadruple carrier frequency.

US 2005/0001748 A1 and WO 2006/124060 A2 describe receiver architectures employing sample rate conversion and delta-sigma modulation, but not a switching amplifier.

SUMMARY OF THE INVENTION

The present invention provides a transmitter comprising a delta-sigma modulator, a sample rate converter situated downstream of the delta-sigma modulator with respect to the direction of transmission signal flow, and a switching amplifier situated downstream of the sample rate converter with respect to the direction of transmission signal flow.

The sample rate converter is situated between the delta-sigma modulator and the switching amplifier, e.g. the invention relates to the use of the sampling rate converter between the base band delta sigma modulator and the switching amplifier. A signal to be transmitted is input to the delta-sigma modulator. The signal processed by the sigma-delta modulator is then passed to the sample rate converter. The resulting sample rate converter signal is subsequently passed to the switching amplifier. Accordingly, the direction of transmission signal flow is from the delta-sigma modulator to the switching amplifier, via the sample rate converter. However, this does not exclude the presence of further processing units between the delta-sigma modulator and the sample rate converter, or between the sample rate converter and the switching amplifier. In particular, filters could be used between the mentioned elements.

The invention allows a decoupling of the clock frequency of the delta-sigma modulator and the carrier frequency, for example in radio frequency (RF) signal generation applications using delta-sigma modulators. The key parameters of the delta-sigma modulator, for example over-sampling ratio and dynamic range, are mainly dependent on the signal bandwidth and not on the carrier frequency. With the invention described herein it is possible to design the DSM independently of the carrier frequency. The decoupling of the clock frequency and the carrier frequency is achieved by providing one of the sample rate converters after each one of the DSMs. In general, the location of the sample rate converter can be directly before the switching amplifier. The invention also provides for better scalability of the DSM for the desired use (bandwidth) and performance (dynamic range). The improved scalability may be used to lower the power dissipation of the DSM and to enable an application-optimised implementation of the DSM. For example, a DSM with a (relatively) low speed grade may be used which is less expensive than comparable high speed grade delta-sigma modulators. The delta-sigma modulator may be a field programmable gate array (FPGA) which is available off-the-shelf and therefore usually cheaper to design and/or manufacture than customized solutions. Moreover, due to the lower clock frequency the device temperature may also be expected to be lower. A higher integration density may also be achieved with the invention described herein.

According to one aspect of the invention, the sample rate converter is an upsampler having an integer up-sampling-rate. In particular, the upsampler may be used to bring the transmission signal from a base band or an intermediate frequency band to a carrier frequency band. When using an integer upsampling-rate the sample rate converter may be kept relatively simple.

According to a second aspect of the invention the upsampler may be a sample-and-hold device. When implemented as a 1:N sample-and-hold device, each input symbol to the sample-and-hold device at a sampling rate of Fx/N is repeated N times at the output. The result is a data stream with a symbol rate of Fx. Up-sampling can be performed by inserting zeros or an alternating sample-zero-pattern such as original sample, zero, repeated sample, zero, . . . .

The delta-sigma modulator may be an analog-to-digital converter (ADC) or a digital-to-digital converter (DDC). The input signals to the DSM(s) can be either analogue or digital signals.

The delta-sigma modulator may be a band pass delta-sigma modulator. A band pass delta-sigma modulator (BP DSM) can be employed if the input signal is already shifted to an intermediate frequency IF.

The switching amplifier and the sample rate converter may be arranged to be operated at a switching frequency $F_s$, and the band path delta-sigma modulator may be arranged to be operated at a quantization frequency of $F_s/R$, wherein R>1. As can be seen, by choosing a suitable value for R, the quantization frequency of the band path delta-sigma modulator (i.e. the operating frequency of the band pass delta-sigma modulator) can be set to a certain value that is sufficient for the desired over-sampling ratio and the desired dynamic range.

The delta-sigma modulator may be a first base band delta-sigma modulator. The input frequency spectrum of the base band delta-sigma modulator begins at DC (0 Hz) and extends to the maximum frequency of the input signal.

The transmitter may further comprise a radio-frequency modulator situated downstream of the sample rate converter, wherein the first base band delta-sigma modulator, the sample rate converter and the radio-frequency modulator form a transmission path for an in-phase signal. The transmitter may further comprise a second base band delta-sigma modulator, a second sample rate converter and a second radio-frequency modulator, wherein the second base band delta-sigma modulator, the second sample rate converter and the second radio-frequency modulator form a transmission path for a quadrature signal. The transmitter may additionally comprise a signal adder arranged to generate a switching amplifier drive signal by adding an output signal of the transmission path for the in-phase signal and an output signal of the transmission path for the quadrature signal. In this exemplary configuration using two base band delta-sigma modulators (BB DSM) the sample rate converters are located between one of the BB DSM and the corresponding RF modulator (radio-frequency modulator). Accordingly, the invention relates to the use of the sampling rate converter after the base band DSM before the RF modulator. In general, the location of the two sampling rate converters on I and Q path can be directly before the modulator where the output of the modulator can drive a switching amplifier.

The switching amplifier may be arranged to be operated at a switching frequency $F_s$. The sample rate converter and the second sample rate converter may be arranged to be operated at the sampling frequency ½ $F_s$ and the first base band delta-sigma modulator and the second base band delta-sigma modulator may be arranged to be operated at a quantization frequency of $F_s/(2R)$, wherein R>1. Instead of operating the delta-sigma modulators at the clock frequency of ½ $F_s$, the present invention allows for the base band delta-sigma modulators to be operated at the significantly lower clock frequency of $F_s/(2R)$.

DESCRIPTION OF THE DRAWINGS

The features of the present invention may be better understood when reading the detailed description and the figures, wherein identical numbers identify identical or similar objects.

FIG. 1: shows a first exemplary configuration of a transmitter according to the present invention.

FIG. 2: shows the spectra of various signals present in the transmitter in one diagram.

DETAILED DESCRIPTION

Figure 3:
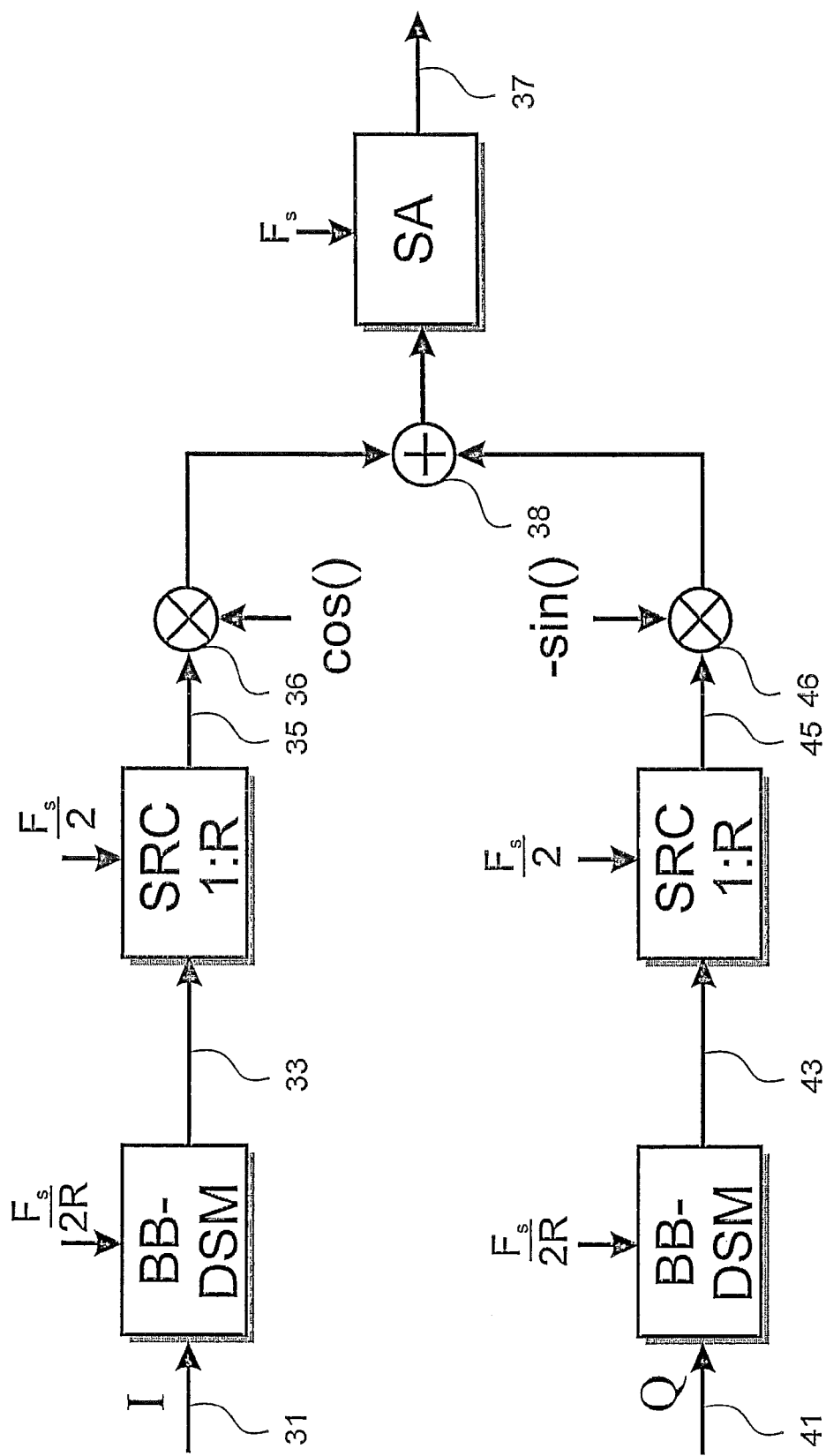
FIG. 3: shows a second exemplary configuration of the present invention.

For a complete understanding of the present invention and the advantages thereof, reference is now made to the following detailed description taken in conjunction with the figures.

It should be appreciated that the various aspects of the invention discussed herein are merely illustrative of the specific ways to make and use the invention and do not therefore limit the scope of the invention when taken into consideration with the claims and the following detailed description.

FIG. 1 shows a first exemplary configuration of a transmitter according to the present invention. While only a few components of the transmitter are shown in FIG. 1, it is clear that an actual transmitter may comprise further elements. The transmitter comprises a band pass delta-sigma modulator (BP DSM), a 1:R sample rate converter (SRC 1:R) and a switching amplifier (SA). An input signal 11 to be transmitted is provided to the input of the band pass delta-sigma modulator. The direction of transmission signal flow is from left to right in FIG. 1, as indicated by the arrows. The input signal 11 can be either a digital signal or an analog signal. The input signal 11 has a bandwidth B and occupies a frequency band, e.g. from $f_{min}$ to $f_{max}$. The input signal 11 also has a dynamic range that needs to be correctly processed by the transmitter.

The band pass delta-sigma modulator BP DSM receives the input signal 11 at an input interface. The band pass delta-sigma modulator BP DSM operates at a clock frequency $F_s/R$. Typically, the value of R is much greater than 1 so that the band pass delta-sigma modulator BP DSM operates at a frequency significantly lower than the actual transmission frequency. The actual transmission frequency may be, for example, in the radio frequency range. A band pass delta-sigma modulator has the effect that the input signal 11 remains virtually unmodified in a certain frequency band, whereas the input signal 11 is attenuated outside of this certain frequency band. Regarding the quantization noise produced by a delta-sigma modulator, the band pass delta-sigma modulator has the opposite effect, i.e. the band pass delta-sigma modulator substantially reduces the quantization noise in the certain frequency band. Outside the certain frequency band defined by the band pass delta-sigma modulator, the quantization noise is relatively strong. The output of the band pass delta-sigma modulator BP DSM is a delta-sigma modulated signal 13. Purely exemplary, FIG. 1 shows a delta-sigma modulated signal $X_{DSM}$ having three levels −1, 0, and 1.

The delta-sigma modulated signal 13 is used as an input for a sample rate converter SRC 1:R. The sample rate converter has a conversion factor of R and produces a sample rate converted signal 15. In general, the conversion factor R may be a positive, rational number and in the context of the present invention the value of the conversion factor R is typically chosen to be greater than 1. If the value of the conversion factor R is greater than 1 then the sample rate converter functions as an upsampler. It is usually desired that the sample rate converter changes the incoming delta-sigma modulated signal 13 as little as possible. Under certain circumstances (e.g. zero-stuffing) the delta-sigma modulated signal 13 is still the same, because no additional information was added to the delta-sigma modulated signal 13. However, due to the higher sampling rate, it is possible (and necessary) to consider a larger range of input frequencies, since the Nyquist rate is also pushed towards higher frequencies of the upsampling process. The sample rate converter outputs a sample rate converted signal 15, an exemplary representation of which with R=4 can be seen in the time diagram depicting a signal $x_{SRC}$ shown in the inset in FIG. 1 The signal $x_{SRC}$ is created by repeating every sample of the signal $x_{DSM}$ R−1=3 times so that, in this example, the new sample rate is R=4 times that of the original sample rate. Other options exist for the sample rate conversion, for example linear interpolation or zero-stuffing.

The sample rate converted signal 15 subsequently enters a switching amplifier SA which operates at a switching frequency $F_s$. The application of the switching amplifiers SA in the RF power amplifiers allows high power efficiencies. A driving signal that drives the switching amplifier SA should have a value of the switching frequency $F_s$ that is higher than the carrier frequency of the RF signal. Often, an H-bridge having four transistor switches is used as the switching amplifier SA. Normally the RF signal still has the same symbol alphabet as the output of the delta-sigma modulator.

FIG. 2 shows a power spectrum diagram displaying the spectra of various signals that are present in the transmitter of FIG. 1. Beginning at the left of FIG. 2, a band pass spectrum 21 can be seen. The band pass spectrum 21 belongs to the input signal 11. The shape of the band pass spectrum 21 is arbitrarily non-symmetric for illustrative purposes. The band pass spectrum 21 has a bandwidth B. The result of the delta-sigma modulation can be seen with SRC spectra 23 which are centred around $F_s/R$. The SRC spectra 23 are image spectra produced by oversampling. Delta-sigma modulation has the effect of pushing the quantization noise out of the frequency band of interest towards lower and higher frequencies. An illustrative quantization noise spectrum (power distribution) 22 is shown in FIG. 2 in the neighbourhood of the band pass spectrum 21. Two SA spectra 25 are the result of the sample rate conversion to the switching frequency $F_s$. The Nyquist range for the signal that is sampled at the frequency $F_s$ now extends from f=0 to $F_s/2$ and is shown as NYQ on FIG. 2. The Nyquist range states that any one of the signals having a frequency within the Nyquist range can be and will be considered during the sampling process. As can be seen in FIG. 2, the quantization noise spectrum 22 and the image SRC spectra 23 are inside the Nyquist range for the sampling signal having the frequency $F_s$. In order to get rid of the unwanted quantization noise spectrum 22 and the image SRC spectra 23, a band pass filter can be used as schematically illustrated in FIG. 2 by the frequency response 24 of this band pass filter. The band pass filter might be a digital filter situated between the band pass delta-sigma modulator BP DSM and the sample rate converter SRC 1:R of FIG. 1. If a filter is applied to the delta-sigma modulator signal, then most of the quantization noise spectrum 22 and the image SRC spectra 23 can be eliminated. This means only the input signal spectrum 21 in the Nyquist range for $F_s$ remains in the Nyquist range. Performing the sample rate conversion to the frequency $F_s$ results in the two image spectra 25 centred around switching frequency $F_s$. The signal corresponding to spectra 25 can be used directly to drive the switching amplifier SA. In the alternative, additional processing could be performed between the sample rate converter SRC 1:R and the switching amplifier SA. For example, to avoid long, repetitive constant values due to the R times repetition of each of the delta-sigma modulated samples, distinctive patterns for each value −1, 0, 1 could be coded and applied to drive the switching amplifier SA. The same effect could be directly achieved by the sample rate converter SRC 1:R. The drive signal for the switching amplifier SA would thus contain more higher frequency portions which may be advantageous for certain transmission modes.

FIG. 3 shows another exemplary configuration of the transmitter according to the present invention that uses quadrature amplitude modulation. The transmitter shown in FIG. 3 comprises an in-phase transmission path for an in-phase signal and a quadrature transmission path for a quadrature signal. The in-phase transmission path receives an in-phase signal 31 (I) as an input signal for the base band delta-sigma modulator BB DSM. The base band sigma-delta modulator BB DSM operates at clock frequency of $F_s/(2R)$. A delta-sigma modulated signal 33 is then sent to a first sample rate converter SRC 1:R. The sample rate converter SRC operates at a frequency $F_s/2$ and thus performs the sample rate conversion with the conversion factor R. The sample rate converted signal 35 is subsequently modulated in a radio-frequency modulator 36. A cosine signal cos( ) serves as the signal to be modulated by the sample rate converted signal 35. The modulated signal is then sent to an adder 38.

The quadrature path is designed in a similar manner. An input-signal 41 (Q) enters the base band delta-sigma modulator BB DSM that operates the clock-frequency of $F_s/(2R)$. The delta-sigma modulated signal 43 is then sent to a second sample rate converter SRC 1:R operating at the frequency of $F_s/2$. The sample rate converter signal 45 enters a radio-frequency modulator 46. The signal to be modulated is a negative sine signal −sin( ). The modulation result produced by radio-frequency modulator 46 also enters the adder 38.

The adder 38 determines the sum of the modulated in-phase signal and the modulated quadrature signal. The sum is sent to the switching amplifier SA operating at the frequency $F_s$. The switching amplifier provides an amplified signal 37 at its output.

In a possible design the sample rate converter(s) is/are realized as an 1:N sample-and-hold device. Each input symbol to the sample-and-hold device at a sample rate of $F_x/N$ is repeated N-times at the output. The result is a data stream with a symbol rate of $F_x$.

While various embodiments of the present teachings have been described above, it should be understood that they have been presented by way of example, and not limitation. It will be apparent to persons skilled in the relevant arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the teachings within this document may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. Transmitter comprising a band pass delta-sigma modulator, a sample rate converter situated downstream of the band pass delta-sigma modulator with respect to a direction of transmission signal flow, and a switching amplifier situated downstream of the sample rate converter with respect to the direction of transmission signal flow, wherein the switching amplifier (SA) and the sample rate converter are arranged to be operated at a switching frequency $F_s$, and wherein the band pass delta-sigma modulator (BP DSM) is arranged to be operated at a quantization frequency of $1/R \, F_s$, wherein R>1.

2. Transmitter according to claim 1, wherein the sample rate converter is an upsampler having an integer up sampling rate.

3. Transmitter according to claim 2, wherein the upsampler is a sample-and-hold device.

4. Transmitter according to claim 1, wherein the delta-sigma modulator is an analogue-to-digital converter or a digital-to-digital converter.

5. Transmitter according to claim 1, wherein the delta-sigma modulator is a first base band delta-sigma modulator.

6. Transmitter according to claim 5, further comprising a radio-frequency modulator situated downstream of the sample rate converter, wherein the first base band delta-sigma modulator, the sample rate converter and the radio-frequency modulator form a transmission path for an in-phase signal, the transmitter still further comprising a second base band delta-sigma modulator, a second sample rate converter, and a second radio-frequency modulator, wherein the second base band delta-sigma modulator, the second sample rate converter and the second radio-frequency modulator form a transmission path for a quadrature signal, wherein the transmitter still further comprises a signal adder arranged to generate a switching amplifier drive signal by adding an output signal of the transmission path for the in-phase signal and an output signal of the transmission path for the quadrature signal.

7. Transmitter according to claim 6, wherein the switching amplifier is arranged to be operated at a switching frequency $F_s$, the sample rate converter and the second sample rate converter are arranged to be operated at a sampling frequency ½ $F_s$, wherein the first base band delta-sigma modulator and the second base band delta-sigma modulator are arranged to be operated at a quantization frequency of $F_s/(2R)$, wherein R>1.

8. A transmitter comprising:
a first base band delta-sigma modulator;
a sample rate converter situated downstream of the delta-sigma modulator with respect to a direction of transmission signal flow;
a switching amplifier situated downstream of the sample rate converter with respect to the direction of transmission signal flow;
a radio-frequency modulator situated downstream of the sample rate converter, wherein the first base band delta-sigma modulator, the sample rate converter and the radio-frequency modulator form a transmission path for an in-phase signal;
a second base band delta-sigma modulator;
a second sample rate converter;
a second radio-frequency modulator, wherein the second base band delta-sigma modulator, the second sample rate converter and the second radio-frequency modulator form a transmission path for a quadrature signal;
a signal adder arranged to generate a switching amplifier drive signal by adding an output signal of the transmission path for the in-phase signal and an output signal of the transmission path for the quadrature signal.

9. Transmitter according to claim 8, wherein the sample rate converter is an upsampler having an integer up sampling rate.

10. Transmitter according to claim 9, wherein the upsampler is a sample-and-hold device.

11. Transmitter according to claim 8, wherein the delta-sigma modulator is an analogue-to-digital converter or a digital-to-digital converter.

12. Transmitter according to claim 8, wherein the switching amplifier is arranged to be operated at a switching frequency $F_s$, the sample rate converter and the second sample rate converter are arranged to be operated at a sampling frequency ½ $F_s$, and wherein the first base band delta-sigma modulator and the second base band delta-sigma modulator are arranged to be operated at a quantization frequency of $F_s/(2R)$, wherein R>1.

* * * * *